United States Patent
Lee

(10) Patent No.: US 6,762,503 B2
(45) Date of Patent: Jul. 13, 2004

(54) INNOVATIVE SOLDER BALL PAD STRUCTURE TO EASE DESIGN RULE, METHODS OF FABRICATING SAME AND SUBSTRATES, ELECTRONIC DEVICE ASSEMBLIES AND SYSTEMS EMPLOYING SAME

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,962

(22) Filed: Aug. 29, 2002

(65) Prior Publication Data

US 2004/0041393 A1 Mar. 4, 2004

(51) Int. Cl.$^7$ .......................... H01L 23/48; H01L 23/52; H01L 29/40
(52) U.S. Cl. .................. 257/781; 257/780; 438/614
(58) Field of Search ............................ 257/780, 781, 257/779, 762, 751; 438/613, 614, 612

(56) References Cited

U.S. PATENT DOCUMENTS

| | | | |
|---|---|---|---|
| 3,392,442 A | * | 7/1968 | Napier et al. |
| 5,767,010 A | * | 6/1998 | Mis et al. |
| 5,773,359 A | * | 6/1998 | Mitchell et al. |
| 5,872,399 A | | 2/1999 | Lee |
| 6,107,180 A | * | 8/2000 | Munroe et al. |
| 6,111,321 A | * | 8/2000 | Agarwala |
| 6,201,305 B1 | | 3/2001 | Darveaux et al. |
| 6,249,044 B1 | * | 6/2001 | Kao et al. |
| 6,316,828 B1 | | 11/2001 | Tao et al. |
| 6,399,417 B1 | | 6/2002 | Lee et al. |
| 6,404,064 B1 | | 6/2002 | Tsai et al. |

OTHER PUBLICATIONS http://www.maxim-ic.com/1st_pages/UCSP.htm, "Wafer-Level Chip-Scale Package," Dallas Semiconductor, date unknown, 10 pages.

"CSP Present and Future," date unknown, 3 pages.

Tarter et al., "Ball Grid Array Performance Characteristics; A User's Design Guide," File Creation Date: Mar. 31, 1999, 10 pages.

"BGA (Ball Grid Array)," National Semiconductor Corporation, Sep. 1999, pps. 1–7, Application Note 1126.

MicroStar BGA Packaging Reference Guide, Sep. 1999, 15 pages, Literature No.: SSYZ015B.

"Mounting Technology," Sharp, File Creation Date: Oct. 10, 2000, pps. 12–36.

"Chapter 7: Board Design and Layout Considerations," FBGA User's Guide, Apr. 12, 2002, pps. 41–45, Version 4.1.

* cited by examiner

Primary Examiner—Sheila V. Clark
(74) Attorney, Agent, or Firm—TraskBritt

(57) ABSTRACT

A solder ball pad for mounting and connecting of electronic devices and, more particularly, apparatus and methods providing an improved solder ball pad structure on a substrate, such as a printed circuit board ("PCB") or a semiconductor die, while enabling better use of the spaces between adjacent solder ball pads and at the same time providing increased surface area for bonding to a solder ball. Substrates, electronic device assemblies and systems incorporating the invention are also disclosed. The inventive solder ball pad structure comprises a metal pad layer that is partially exposed by an aperture in an insulative mask layer, but not exposing any surrounding substrate surface, an optional metallic or polymer interface layer formed onto at least a portion of the exposed area of the metal pad layer and onto at least a portion of a sidewall of the solder mask formed by the aperture as well as extending onto the top surface of the solder mask, a copper layer formed onto the interface layer (if used), and extending up the vertical wall and out over the top surface of the solder mask, followed by nickel and gold layers to enhance the wettability of the resulting solder ball pad surface.

57 Claims, 6 Drawing Sheets

INNOVATIVE SOLDER BALL PAD STRUCTURE TO EASE DESIGN RULE, METHODS OF FABRICATING SAME AND SUBSTRATES, ELECTRONIC DEVICE ASSEMBLIES AND SYSTEMS EMPLOYING SAME

BACKGROUND OF THE INVENTION

1. Field of the Invention

The present invention relates generally to the mounting and connecting of electronic devices and, more particularly, to apparatus and methods providing an improved solder ball pad structure on a substrate such as a printed circuit board ("PCB") or a semiconductor die.

2. State of the Art

An increasing demand for electronic equipment that is smaller, lighter, and more compact has resulted in a concomitant demand for semiconductor packages that have smaller outlines and mounting areas or "footprints."

One response to this demand has been the development of the so-called "flip-chip" method of attachment and connection of semiconductor chips to substrates. Sometimes referred to as the "Controlled Collapse Chip Connection," or "C4," method, the technique involves forming balls of a conductive metal, e.g., solder or gold, on input/output connection pads on the active surface of the chip, then inverting, or "flipping" the chip upside down, and "reflowing" the conductive balls, i.e., heating them to the melting point, to fuse them to corresponding connection pads on a substrate.

Another response has been the development of a so-called ball grid array ("BGA") semiconductor package that "surface mounts" and electrically connects to an associated carrier substrate, e.g., a printed circuit board ("PCB"), with a plurality of solder balls in a method sometimes referred to as the "C5" method that is analogous to the flip-chip method described above for mounting and connecting dies.

In both the C4 die and C5 package mounting and connection methods, a plurality of solder balls is attached to respective solder ball mounting lands, or pads, defined on a surface of the die or interposer substrate. The solder ball mounting pad may be defined by an opening in an insulative layer or mask called a "passivation layer" in the case of a semiconductor die, or a "solder mask" in the case of an interposer substrate of a BGA package, as described below. The interposer substrate in a BGA package may comprise a rigid or flexible sheet material.

In a solder-mask-defined ("SMD") solder ball pad, an aperture formed in the mask over a terminal pad defines the solder ball pad mounting area. Typically, the terminal pad comprises a layer of metal, e.g., copper, aluminum, gold, silver, nickel, tin, platinum, or a multilayer combination of the aforementioned that has been laminated and/or plated on a surface of the substrate sheet and then patterned using known photolithography techniques. Further, one or more circuit traces may be formed simultaneously with the terminal pads using the same processes. In addition, a plated through-hole, called a "via," may also be formed and may connect the pad layer with the opposite surface of the substrate sheet.

A solder mask is then formed over the metal terminal pad and may comprise an acrylic or a polyimide plastic or, alternatively, an epoxy resin that is silk screened, spin-coated or applied as a preformed film on the substrate sheet. An aperture is formed in the solder mask to expose a portion of the terminal pad, but not any portion of the surrounding substrate surface. A solder ball may be attached to or formed on the terminal pad area thus exposed; however, the solder mask prevents the solder of the solder ball from attaching to any portion of the terminal pad other than the mounting area that is exposed through the aperture. Thus, the exposed area is referred to as an SMD-type of solder ball mounting pad.

Comparatively, a nonsolder-mask-defined ("NSMD") solder ball mounting pad may be formed in a similar manner, the exception being the size of the aperture in the solder mask. In particular, typically, the NSMD pad exposes the entire terminal pad, at least a portion of the surface of the substrate sheet and, optionally, a portion of an adjacent circuit trace, such that the molten solder of the solder ball can attach to the entire surface and peripheral vertical side surface of the terminal pad thus exposed. Typically, a circular-shaped terminal pad and a portion of a circuit trace are exposed in an NSMD solder ball mounting pad arrangement. The connection area of both the SMD-type and NSMD-type solder ball mounting pads may be coated with a nickel layer and then a gold layer to enhance wettability of solder thereon.

Each of the conventional SMD and the NSMD solder ball mounting pads have some advantages as well as disadvantages associated with it.

Turning to the SMD solder ball pad, it provides relatively good "end-of-line" (i.e., at the end of the semiconductor package fabrication line) ball shear resistance because the solder mask overlaps the peripheral edge of the terminal pad proximate to the exposed area defining the solder ball mounting pad and, therefore, resists ripping of the terminal pad from the substrate when mechanical forces act on the solder ball attached thereto. In contrast, the NSMD solder ball pad has a relatively lower end-of-life shear resistance because the solder mask does not cover the peripheral edge of the NSMD terminal pad.

The SMD solder ball pad also affords relatively better control of the lateral (x-y) position of the solder ball on the surface of the substrate than does an NSMD solder ball pad. This is because the lateral position of the solder ball on the substrate may be affected by two factors: 1) the position on the substrate of the centroid of the aperture in the solder mask, if the vertical wall of the aperture interacts (e.g., touches, or electrostatically interacts) with the solder ball, and 2) the position of the centroid of the area of the metal pad layer that is exposed by the opening in the mask, i.e., the area wetted by the molten solder of the solder ball when the latter is attached to the solder ball pad. In both instances, the center of gravity of the solder ball tends to align itself over each of the two respective centroids if both factors apply. As a result, when the centroid of the aperture does not coincide with the centroid of the exposed area of the mounting pad and the vertical wall of the aperture interacts with (e.g. touches) the solder ball, the center of gravity of the solder ball may be positioned approximately half way along a line extending between the two centroids. Since in an SMD solder ball pad the aperture in the solder mask exposes only pad layer metal, the centroid of the aperture and exposed metal pad layer coincide. Thus, so long as the aperture in the solder mask is located within the periphery of the metal pad layer, the lateral tolerances of the SMD solder ball will depend substantially on the lateral positional tolerances on the centroid of the aperture.

However, the shape of the NSMD solder ball pad exposed by the aperture in the solder mask includes a terminal pad portion as well as a portion of the circuit trace. Further, the vertical wall of the aperture may not touch the solder ball. Consequently, the centroid of the NSMD solder ball pad, i.e., of the exposed area of metal, is shifted slightly toward the circuit trace and away from the centroid of the opening, which is typically centered on the terminal pad portion. Hence, the center of gravity of the solder ball will be positioned according to the respective centroids of the NSMD solder ball pad and the circuit trace. Thus, the lateral tolerances on the solder ball on an NSMD solder ball pad may depend not only on the lateral tolerances of the centroid of the aperture, but also the lateral tolerances of the centroid of the exposed metal of the metal pad layer as well. Moreover, even without the presence of a circuit trace, misalignment of the solder ball can still occur in an NSMD pad if the centroid of the exposed pad is not sufficiently aligned with the centroid of the aperture, and thus a vertical sidewall of the aperture interacts with the solder ball.

While the lateral misalignment of a solder ball relative to an opening resulting from this "shift" is relatively small, it should be understood that a C4-mounted die or a C5-mounted semiconductor package can typically have a large number, e.g., up to nine hundred, of such solder balls on its mounting surface, and that accordingly, these slight misalignments in the array of balls can be additive, such that in some cases, the die or package cannot be successfully mounted to an associated mounting surface.

As a further comparison between SMD and NSMD solder ball pads, the solder ball attached to an NSMD solder ball pad attaches to the vertical side surface of the exposed metal of the terminal pad including the circuit trace(s), if any. It is postulated that this side surface attachment and resulting arcuate attachment structure helps to distribute stresses resulting from thermal aging so that the stresses do not concentrate at the interface between the NSMD solder ball pad and the solder ball. Thus, the NSMD may provide an improved resistance to thermal stresses over the SMD solder ball pad, the solder ball/pad interface of which consists of a simple planar interface between the exposed portion of the terminal pad and the solder ball.

U.S. Pat. No. 6,201,305 to Darveaux et al. as well as U.S. Pat. No. 5,872,399 to Lee each describes a solder ball pad structure. More specifically, the Darveaux reference describes an NSMD-type solder ball pad structure wherein a layer of metal on the substrate is formed into a terminal pad, the pad having at least two spokes radiating outwardly from it. The pad structure with spokes is exposed by way of an aperture formed through the solder mask such that the terminal pad and an inner portion of each of the spokes is exposed therethrough, and an outer portion of each of the spokes is covered by the mask. The Lee reference describes a solder ball pad structure having a terminal etching hole as well as a plurality of etching holes at the outer portion of the solder ball pad structure for increasing the contact area for a solder ball.

Another area of interest is the design flexibility in the number of circuit traces that may be operably positioned to run between two adjacent solder ball pads with adequate spacing between the traces and between the traces and the solder ball pads. More specifically, the aforementioned tolerance considerations, as well as the differences in the formation of SMD and NSMD solder ball pads, must be factored in determining the spacing between circuit traces and solder ball pads. Of course, dimensional tolerances as well as parameters required to achieve a robust design limit the ability to position additional circuit traces between solder ball pads for a given solder ball pad design pitch.

In view of the foregoing, a method for fabricating solder ball mounting pads on a substrate and resulting solder ball mounting pads which improve on both types of conventional solder ball pads and eliminates some of their respective disadvantages would be desirable.

BRIEF SUMMARY OF THE INVENTION

The present invention comprises an apparatus and method providing an inventive solder ball pad structure and substrates, electronic device assemblies and systems employing same. The solder ball pad structure of the present invention includes a metal terminal pad that is partially exposed by an aperture in a solder mask layer which does not expose any portion of a surrounding substrate surface. In addition, an optional metallic or conductive polymer interface layer may be formed onto at least a portion of the exposed area of the metal terminal pad and onto at least a portion of the vertical sidewall of the solder mask defining the aperture as well as extending onto the surrounding top horizontal surface of the solder mask. Alternatively, an optional nonconductive polymer interface layer may be formed onto the surrounding top surface of the solder mask. A copper layer comprising an electroless copper seed layer as well as an optional electroplated copper layer may be formed over the solder mask, into the aperture and over the exposed portion of the terminal pad. Nickel and gold layers may be applied by electroplating to the copper layer to enhance the wettability to solder of the resulting pad surface. The solder ball pad structure of the present invention may be termed a ball pad on solder mask or "BPS."

The solder ball pad structure of the present invention provides a variety of advantages. First, the lateral positional tolerance of an attached solder ball is largely determined by the tolerances associated with the formation of the solder mask, similar to the SMD solder ball pad. Additionally, the optional interface layer and subsequent metal layers which may be attached to the metal terminal pad enable the solder ball to attach to the vertical side surface of the aperture in the resulting structure, which configuration may provide enhanced thermal stress distribution in the solder ball connection. Also, the solder ball pad of the present invention also provides increased surface area for solder ball attachment, as well as an indented surface for attachment which may further strengthen the bond between a solder ball and the inventive solder ball pad structure.

As another advantage, the solder ball pad structure of the present invention provides additional, usable lateral space on the substrate between adjacent solder ball pads for circuit traces and circuit trace spacing. Because the layered structure above the metal terminal pad on the substrate increases the area for attachment for the solder ball, in excess of the metal pad layer area that is exposed via the solder mask aperture, the size of the metal terminal pad may be reduced. This enables additional circuit traces or spacing to be employed between adjacent solder ball pads, as desired.

It is also contemplated that the structure of the present invention has utility with discrete conductive elements other than solder, such as conductive or conductor-filled epoxy. Accordingly, the term "solder ball pad" is exemplary and not limiting of the scope of the present invention.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
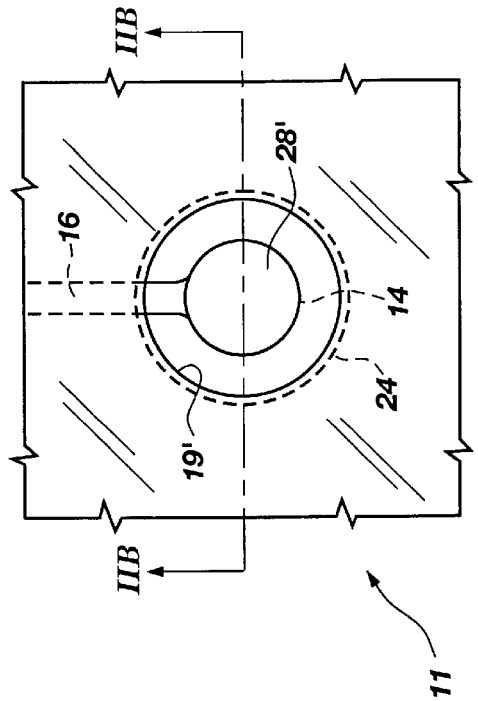
FIG. 1A is a top view of a conventional SMD solder ball pad.
Figure 1B:
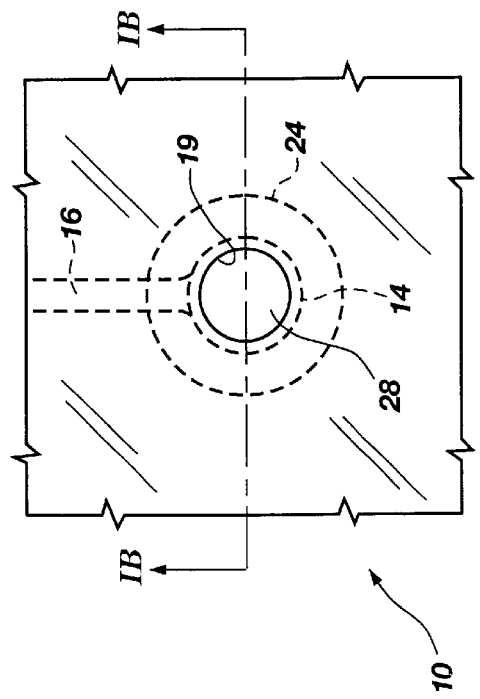
FIG. 1B is side cross-sectional view of the SMD solder ball pad shown in FIG. 1A.

Referring again to conventional practices to provide a more detailed basis for comparison with the present invention and not in any way in limitation of the scope thereof, FIG. 1A is a top view of a portion of a conventional SMD substrate 10 having a solder-mask-defined ("SMD") solder ball mounting pad 28 formed thereon. FIG. 1B is a cross-sectional view looking into the SMD substrate 10 and mounting pad 28 along the lines IB—IB in FIG. 1A. The SMD substrate 10 may comprise a sheet 12 of an insulative material, such as bismaleimide triazine, flexible polyimide film or tape, fiberglass, polyimide tape, ceramic, or silicon, or, alternatively, it may comprise a semiconductor chip or die. The SMD substrate 10 typically comprises a layer of metal, e.g., copper, aluminum, gold, silver, nickel, tin, platinum, or a combination of the foregoing that has been laminated and/or plated on a surface of the substrate sheet 12, then patterned using known photolithography techniques into a terminal pad 14, which may include one or more circuit traces 16 (shown by dotted lines) extending from it. In addition to the circuit traces 16, a plated through-hole, called a "via" (not shown), may connect the terminal pad 14 with the opposite surface of the substrate sheet 12 as known in the art.

An insulative layer in the form of solder mask 20 is formed over the metal layer, including the terminal pad 14. The solder mask 20 may comprise an acrylic or a polyimide plastic or, alternatively, an epoxy resin that is silk screened or spin-coated on the sheet 12. A dry film solder mask may also be employed. An aperture 19 is formed in the solder mask 20 to expose a mounting pad portion 28 of the terminal pad 14, and a solder ball 24 (shown dotted in FIG. 1A) is attached to or formed on the mounting pad 28 thus exposed. Since the solder mask 20 prevents the solder of the solder ball 24 from attaching to any portion of the terminal pad 14 other than the mounting pad 28 that is exposed through the aperture 19, the mounting pad 28 is referred to as a solder-mask-defined or SMD-type of solder ball mounting pad, as described above.

Figure 2A:
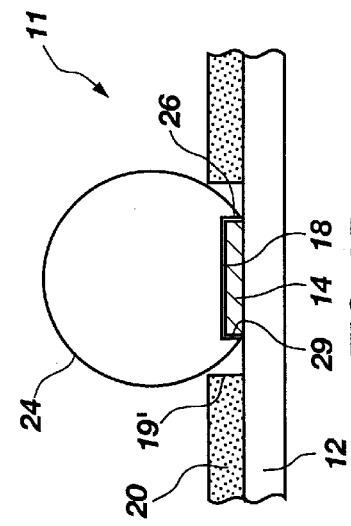
FIG. 2A is a top view of a conventional NSMD solder ball pad.
Figure 2B:
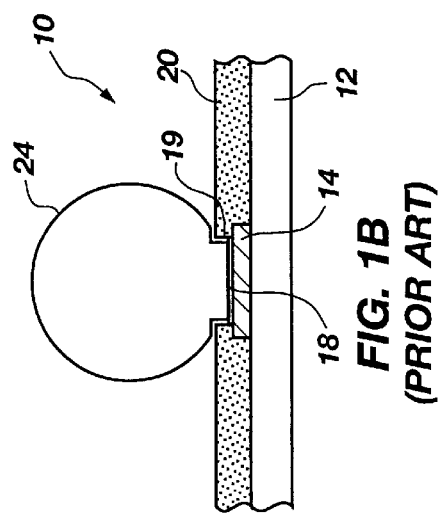
FIG. 2B is side cross-sectional view of the NSMD solder ball pad shown in FIG. 2A.

In further illustration of conventional practices for purposes of comparison with the present invention and not in any way in limitation of the scope thereof, a conventional NSMD substrate 11 is illustrated in the top view of FIG. 2A, wherein features similar to those in the SMD substrate 10 of FIG. 1A are numbered similarly. FIG. 2B is a cross-sectional view looking into the NSMD substrate 11 and mounting pad 28' along the section lines IIB—IIB in FIG. 2A.

As may be seen from a comparison of the two sets of figures, the respective mounting pads 28 and 28' are very similar, the exception being the relative sizes of the apertures 19 and 19' in the solder mask 20. In particular, in the NSMD mounting pad 28' of FIGS. 2A and 2B, the aperture 19' exposes the entire terminal pad 14, along with a portion of the surface of the substrate sheet 12 and a portion of the optional, adjacent circuit trace 16, such that the molten solder of the solder ball 24 can wet and attach to not only the entire upper surface of the terminal pad 14, but also to the vertical peripheral side surface 26 of the terminal pad 14 and the optional circuit trace 16. Along the vertical side surface 26 of the terminal pad 14, the solder ball 24 attaches and forms a curved attachment surface 29 with the vertical peripheral side surface 26 of the terminal pad 14.

It is conventional in the industry to plate solder ball mounting pads 28 and 28' with a layer of nickel, followed by a layer of gold, shown in combination in FIGS. 1B and 2B as solderability enhancement layer 18, to improve the solderability of the pads. Alternatively, terminal pads 14 may be supplied with nickel/gold, tin/lead, or silver coatings, or may be treated to prevent oxidation of the metal surface of the terminal pad 14.

Figure 3A:
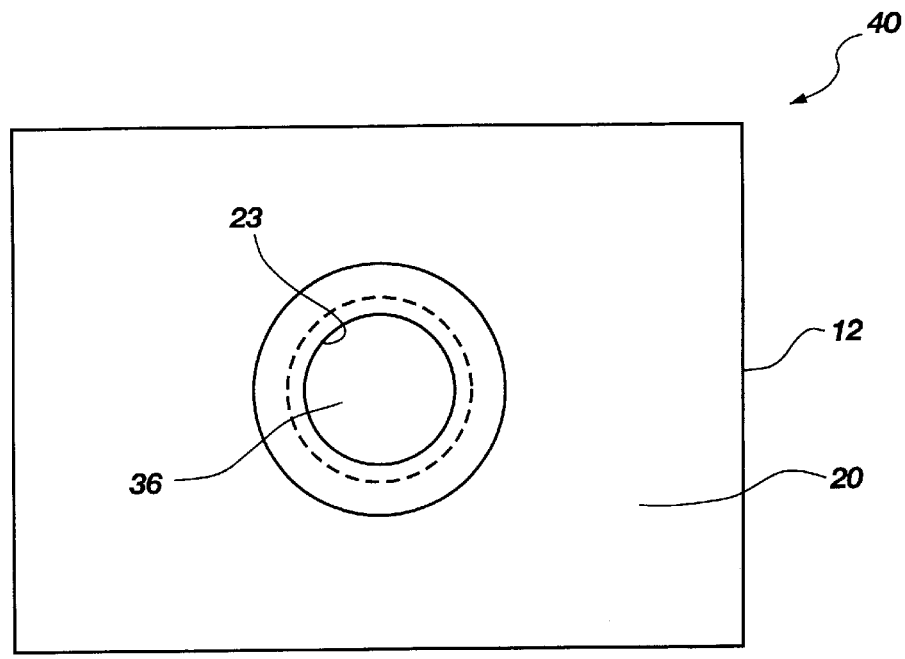
FIG. 3A is a top view of an embodiment of the solder ball pad structure of the present invention.
Figure 3B:
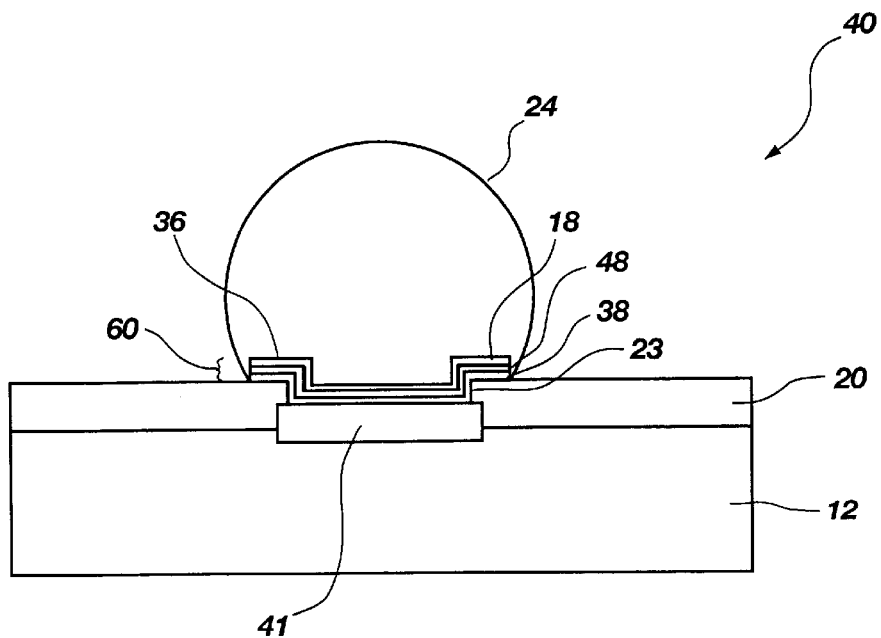
FIG. 3B is a side cross-sectional view of an embodiment of the solder ball pad structure shown in FIG. 3A.

FIGS. 3A and 3B show a top and side cross-sectional view of the BPS substrate 40 with solder ball mounting pad 36 according to the present invention. Solder mask 20 exposes an area of the terminal pad 41 on insulative material sheet 12 by way of aperture 23. Interface layer 38 is formed onto the exposed surface area of the terminal pad as well as extending onto the vertical sidewall of the aperture 23 and onto the top horizontal surface of the solder mask 20. Interface layer 38 may be used to enhance the adhesion of the subsequent copper layer to the solder mask 20 surface, and may comprise an epoxy, such as HYSOL®EO1073 or EO1075, from Henkel Loctite Corporation, Connecticut. Interface layer 38 may optionally comprise a metal plated layer formed by using an electroless plating solution or a conductive polymer, as described in more detail below. Copper layer 48 is formed over the terminal pad 41 as well as interface layer 38, if present, thus extending along the horizontal portion of the terminal pad 41 and onto the sidewall of the solder mask 20 defining aperture 23, and also onto the horizontal top surface of the solder mask 20. Copper layer 48 may comprise an electroless copper seed layer (which may be the interface layer 38) followed by an electroplated copper layer or may be otherwise formed as known in the art. Further, nickel and gold layers, collectively shown as solderability enhancement layer 18 for clarity, may be applied to the copper layer 48 to enhance the wettability to solder of the resulting mounting pad surface. Nickel is used to prevent diffusion of copper to the solder ball pad surface and gold is used for solder wettability. Thus, optional interface layer 38, copper layer 48 and solderability enhancement layer 18 together comprise a solder ball pad layer 60.

Because the interface layer 38 as well as the copper layer 48 and solderability enhancement layer 18, due to their extension up the sidewall of solder mask 20 defining aperture 23 and over onto the outer surface of solder mask 20, may provide a larger surface area than the area that would be exposed by aperture 19 in a typical SMD-type solder ball pad, the size of terminal pad 41 of a BPS solder ball pad structure may be accordingly reduced. Stated another way, to achieve a final bonding area that is equal to a given SMD mounting pad area, the terminal pad 41 formed from the metal layer deposited on the surface of the substrate sheet may be smaller than the terminal pad 14 of an SMD or NSMD configuration. Reducing the size of terminal pad 41 may allow for more lateral space between adjacent terminal pads to become available on the surface of sheet 12. By way of example only, solder ball pad layer 60 may exhibit a diameter of about 0.33 millimeters or larger and a total surface area of about 0.05 square millimeters or greater.

Moreover, the combination of interface layer 38, copper layer 48, and solderability enhancement layer 18 may comprise a multitude of configurations. For instance, each layer may be formed in selected areas to improve solder ball bonding characteristics. More particularly, the interface layer 38 may only be deposited over the solder mask 20, or over selected portions of the solder mask 20 to anchor the subsequent layers thereto. Similarly, the copper layer 48 and solderability enhancement layer 18 may be configured in different arrangements as well. Furthermore, aforementioned layers comprising the BPS solder ball pad structure may be disparate areas that are not contiguous or continuous. Thus, it may be desired to form separate copper regions that form the copper layer 48. Likewise, separate solderability enhancement regions may, in combination, form the solderability enhancement layer 18. Also, each layer is not required to be the same size as other layers. For instance, the solderability enhancement layer 18 may extend onto the vertical side of the copper layer 48, or may extend laterally along the substrate surface beyond either the copper layer 48 and/or interface layer 38.

Suitable and exemplary rigid insulative sheet materials 12 for a BPS substrate include BT832, MGC, MCL679, FR-4, FR-5 materials from Hitachi Co., Japan. Suitable and exemplary flexible insulative sheet materials 12 for a BPS substrate include polyimide layers or fibers such as UPILEX™ from Ube Industries Ltd., Japan, ESPANEX™ from Nippon Steel Chemical Co. Ltd., Japan, and KAPTON™ and MICROLUX™ commercially available from E.I. Dupont de Nemours Company, as well as Polytetrafluoroethylene (PTFE), and a liquid crystal polymer. It should also be noted that the term "sheet" as used herein encompasses not only a self-supporting structure but a layer of material supported on another structure.

AUS5, AUS308, AUS303, or AUS7 from Taiyo, Japan, and DSR2200 from Tamura, Japan, are examples of commercially available materials suitable for use in forming solder masks 20 for a rigid BPS substrate. AUS 11, AUS21 and PSR8000FLX from Taiyo, Japan and CFP1122 and CFP1123 from Sumilite, Japan, are exemplary materials suitable for use with flexible BPS substrates.

Figure 4A:
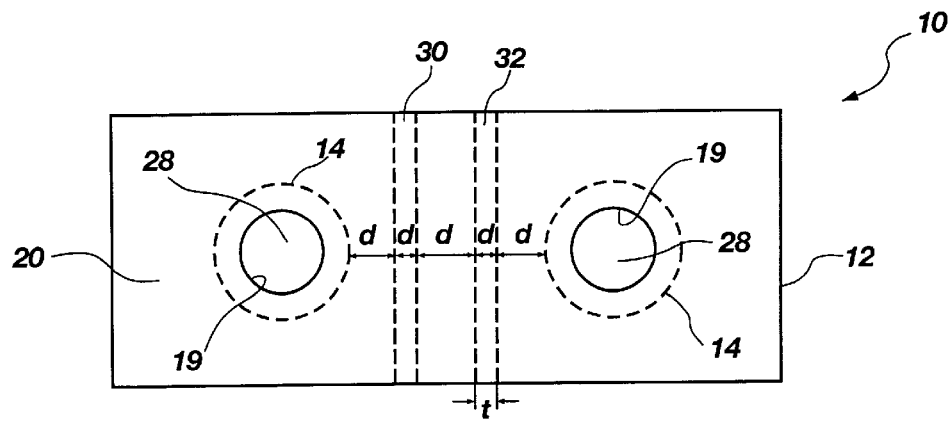
FIG. 4A is a top view of an SMD solder ball pad configuration wherein two circuit traces extend between two SMD solder ball mounting pads.

FIG. 4A shows a conventional SMD substrate 10 configuration having two solder ball mounting pads 28, formed by apertures 19 defined by sidewalls 21 (FIG. 4B) of solder mask 20 that expose mounting pads of the terminal pads 14 formed on the substrate sheet 12, respectively. The distance between terminal pads 14 as well as tolerances in positioning the terminal pads 14 may substantially influence the amount of space in which to position conductive traces 30 and 32 extending between solder ball mounting pads 28. The spacing between traces 30 and 32 is determined from a number of variables. The distance between the centers of the terminal pads 14, termed "solder ball pad pitch," the terminal pad diameter, the conductive trace thickness t, the number of conductive traces, the lateral tolerance in forming conductive traces 30 and 32 and terminal pads 14, as well as the solder ball pad design all may influence the spacing d that may be afforded for placement of conductive traces 30 and 32 in relation to the terminal pads 14 on the substrate sheet 12. In addition, it is common for the trace thickness t to be equal to the spacing between the traces.

Figure 4B:
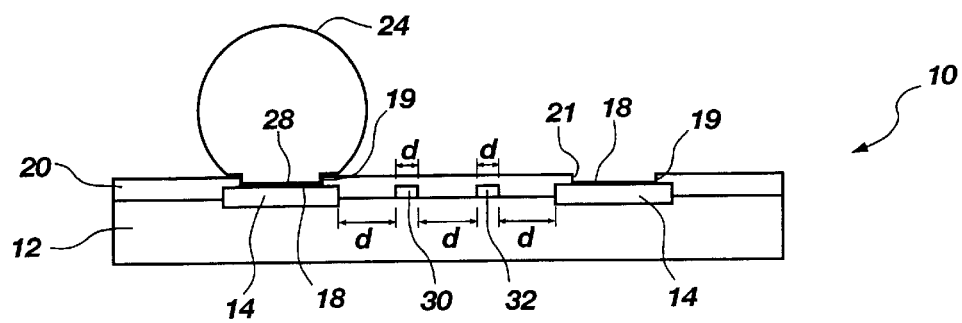
FIG. 4B is a side cross-sectional view of the SMD solder ball pad configuration shown in FIG. 4A.

FIG. 4B shows a side cross-sectional view of the SMD substrate 10 shown in FIG. 4A, but also including an example of a solder ball 24 (not shown in FIG. 4A) attached to the left-hand mounting pad 28. The distance d between a terminal pad 14 and conductive trace 30, conductive trace 30 and conductive trace 32, as well as conductive trace 32 and another terminal pad 14 is shown. For ease of illustration, trace or line widths and space widths are taken to be substantially the same. Distance d, the spacing between a trace and another trace or a trace and a terminal pad for SMD-type solder ball pad configurations, may be determined by the following design rule:

$$d_{SMD} = \frac{S_{pitch} - P_{dia} - 2Tol}{N} \qquad \text{Equation 1}$$

Where:

$d_{SMD}$ is the spacing between a trace and another trace or a trace and a terminal pad.

$S_{pitch}$ is the solder ball pad pitch, or distance between the centers of the two pads.

$P_{dia}$ is the terminal pad diameter.

Tol is the soldermask positional tolerance.

N is the number of spaces and traces required.

Applying Equation 1 to FIGS. 4A and 4B, with assumed dimensions as follows, $S_{pitch}$=0.650 mm $P_{dia}$=0.300 mm Tol=0.050 mm N=5 (As c an be seen in FIG. 4B, the number of spaces "d" is 5 for two circuit traces and three intervening spaces between pads, assuming equal spacing and trace widths)

$$d_{SMD} = \frac{.650 \text{ mm} - .300 \text{ mm} - 2 \cdot .050 \text{ mm}}{5} \qquad \text{(two circuit traces)}$$

-continued $$d_{SMD} = 0.050 \text{ mm}$$

Figure 5B:
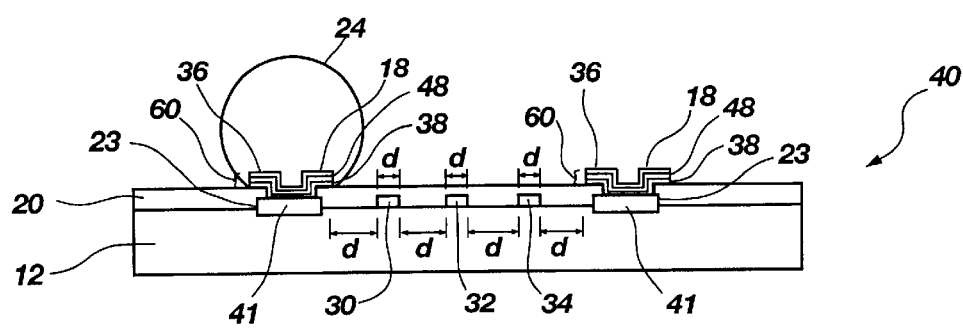
FIG. 5B is a side cross-sectional view of the solder ball pad configuration of the present invention shown in FIG. 5A.
Figure 5A:
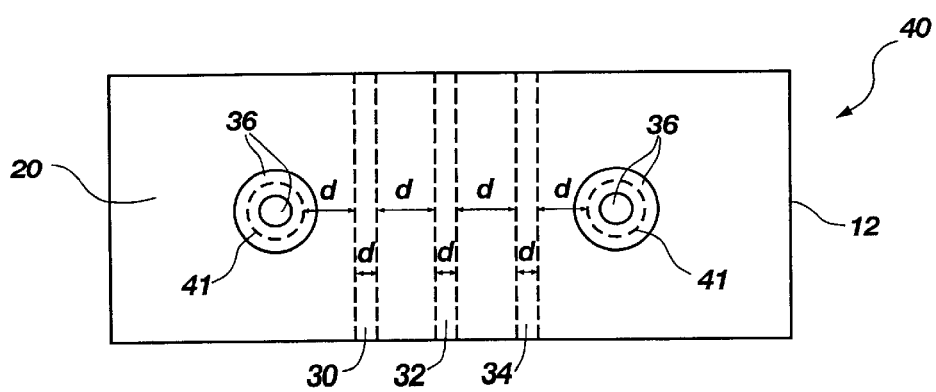
FIG. 5A a top view of a solder ball pad configuration of the present invention wherein three circuit traces extend between two solder ball mounting pads.

Comparatively, FIGS. 5A and 5B show a top and side cross-sectional view, respectively, of an embodiment of the BPS substrate 40 of the present invention. Although none of the drawings are drawn to scale and are for illustration purposes only, the sizes of the BPS mounting pads 36, as defined by apertures 23, respectively, are shown as substantially equal to the mounting pad 28 size as shown FIG. 4A. However, the terminal pads 41 of the BPS substrate 40 are smaller than the terminal pads 14 of the SMD substrate 10 shown in FIGS. 4A and 4B. Since the BPS mounting pads 36 are formed onto the top surface of the solder mask 20, their outer extents do not influence the placement of conductive traces 30, 32 and 34. Instead, the smaller terminal pads 41 may allow for additional spacing or additional conductive traces to be placed between BPS terminal pads 41. Further, since the copper layer 48 extends over the solder mask 20, it may be, for example, a diameter or width of at least 0.3 mm and preferably 0.35 mm to ensure good solder joint reliability using BPS mounting pads 36 without any reduction in circuit trace or spacing width.

Determining circuit trace spacing of the BPS solder ball pad configuration of the present invention may be accomplished by using Equation. 1, used for SMD solder ball pad configurations; however, the terminal pad size may be reduced.

For instance, applying the design rule of Equation 1 to the embodiment of the present invention shown in FIGS. 5A and 5B, with assumed dimensions as follows, $S_{pitch}$=0.650 mm $P_{dia}$=0.150 mm Tol=0.050 mm N=7 (As can be seen in FIG. 5B, the number of spaces "d" is seven for three circuit traces and four intervening spaces between pads)

$$d_{BPS} = \frac{.650 \text{ mm} - .300 \text{ mm} - 2 \cdot .050 \text{ mm}}{7}$$

$$d_{BPS} = 0.057 \text{ mm}$$

Accordingly, the present invention may enable an increased number of traces to be placed between two solder ball pads of the present invention since the spacing size d may remain substantially identical to the spacing required for conventional bond pads having a smaller number of traces therebetween. Alternatively, additional space may be used to provide additional lateral clearance between the same number of traces; thus increased yield may result.

For example, employing the BPS solder ball configuration of the present invention wherein two traces extend between two solder ball pads, the spacing may be determined as follows:

$S_{pitch}$=0.650 mm $P_{dia}$=0.150 mm

Tol=0.050 mm

N=5 (for two circuit traces and three intervening spaces)

$$d_{BPS} = \frac{.650 \text{ mm} - .150 \text{ mm} - 2 \cdot .050 \text{ mm}}{5}$$

-continued $$d_{BPS} = 0.080 \text{ mm}$$

Thus, the present invention may enable more traces to be formed between solder ball pads of the present invention and/or alternatively, increased spacing between a trace and another trace or a trace and a terminal pad, as well as in circuit trace width, in relation to the conventional SMD pad configuration.

Figure 6A:
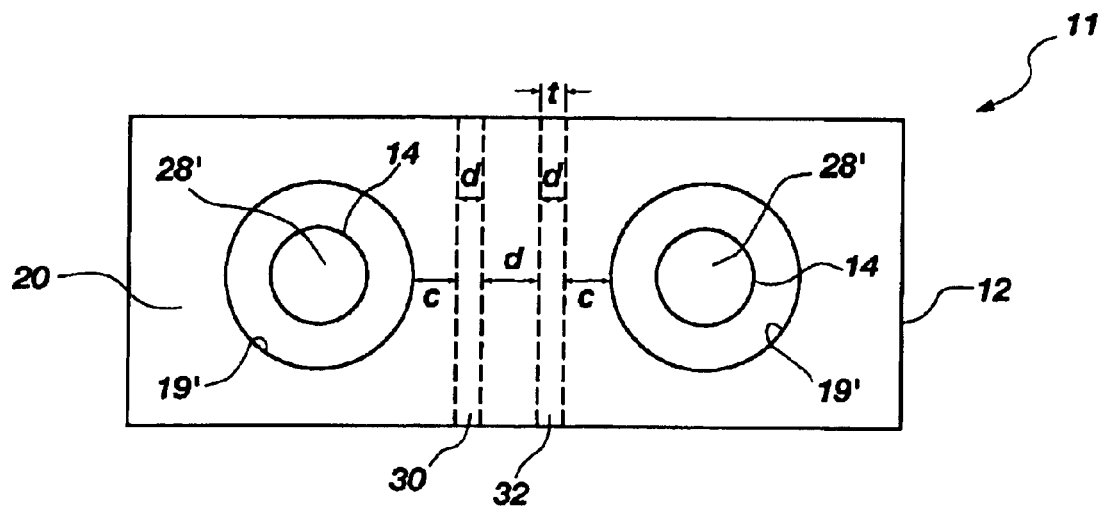
FIG. 6A is a top view of an NSMD solder ball pad configuration wherein two circuit traces extend between two NSMD solder ball mounting pads.
Figure 6B:
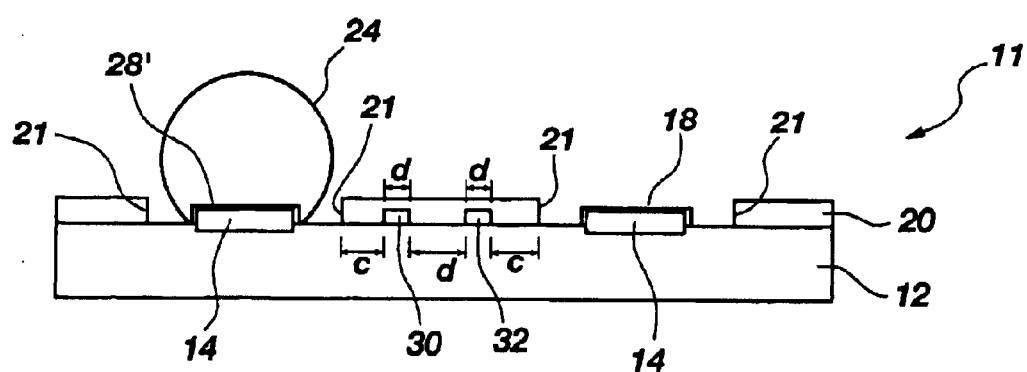
FIG. 6B is a side cross-sectional view of the NSMD solder ball pad configuration shown in FIG. 6A.

FIGS. 6A and 6B show a conventional NSMD substrate 11 wherein two traces 30 and 32 extend between the terminal pads 14. FIG. 6A shows apertures 19' exposing the entire terminal pads 14, terminal pads 14 forming mounting pads 28'.

FIG. 6B shows a side cross-sectional view of the solder ball pad configuration shown in FIG. 6A, but also including an example of a solder ball 24 (not shown in FIG. 6A) attached to left-hand mounting pad 28'. The distance d between a terminal pad 14 and conductive trace 30, conductive trace 30 and conductive trace 32, as well as conductive trace 32 and a terminal pad 14 is shown. Distance d, the spacing between a trace and another trace or a trace and a terminal pad, is also commonly used as the trace width as well as the spacing distance between the vertical sidewall 21 of aperture 19' and a terminal pad 14. In addition, in an NSMD-type substrate, it is common for the design rule to specify a clearance distance between a vertical sidewall of an aperture, for instance vertical sidewall 21 of aperture 19', and the nearest sidewall of a trace, for instance, conductive trace 30.

Distance d, for the NSMD solder ball pad configuration shown in FIGS. 6A and 6B, may be determined by the following design rule:

$$d_{NSMD} = \frac{S_{pitch} - Aperture_{dia} - 2Tol - 2C}{N} \qquad \text{Equation 2}$$

Where:

$d_{NSMD}$ is the spacing between a trace and another trace or a trace and a terminal pad.

$S_{pitch}$ is the solder ball pad pitch, or distance between the centers of the two pads.

$Aperture_{dia}$ is the aperture diameter.

Tol is the soldermask positional tolerance.

C is the trace clearance, to ensure that the solder mask covers the trace.

N is the number of traces required and intervening spaces between the total number of traces.

For example, applying Equation 2 to two traces lying between two NSMD solder ball pads, as shown in FIGS. 6A and 6B, the spacing may be determined as follows:

$S_{pitch}$=0.650 mm $Aperture_{dia}$=0.300 mm

Tol=0.050 mm

C=0.030 mm

N=3 (for two traces and one intervening space between traces)

$$d_{NSMD} = \frac{.650 \text{ mm} - .300 \text{ mm} - 2 \cdot .050 \text{ mm} - 2 \cdot .030 \text{ mm}}{3}$$

$$d_{NSMD} = 0.063 \text{ mm}$$

Referring back to FIGS. 5A and 5B, the BPS substrate 40 of the present invention may offer increased spacing distance between elements formed on the surface of the substrate when compared to the SMD substrate 10 or the NSMD substrate 11 for an equal number of circuit traces. Also, since the BPS mounting pad 36 is positioned in part above the solder mask 20, the BPS mounting pad size may offer a surface area equal to or greater than the SMD mounting pad 28 and/or the NSMD mounting pad 28' sizes.

In addition, the BPS substrate 40 of the present invention may offer increased flexibility in design and improved bonding configurations. For instance, a BPS solder ball pad layer may be configured to further increase the surface area for attaching a solder ball thereto. More particularly, a BPS solder ball pad layer may be configured with scallops, radially extending fingers, apertures, or otherwise geometrically configured to increase the surface area or improve the bonding characteristics of a solder ball connection thereto. Further, a BPS solder ball pad layer may be configured to expose a portion of the terminal pad for connection to a solder ball in combination with the solder ball connection surface of the BPS solder ball pad layer. Additionally, as patterning of metal, and specifically copper, to define a solder ball pad layer is more accurate than solder mask patterning, a BPS solder ball pad layer offers superior positional and size tolerances as compared to an SMD solder ball mounting pad.

Figures 7A, 7C, 7E:
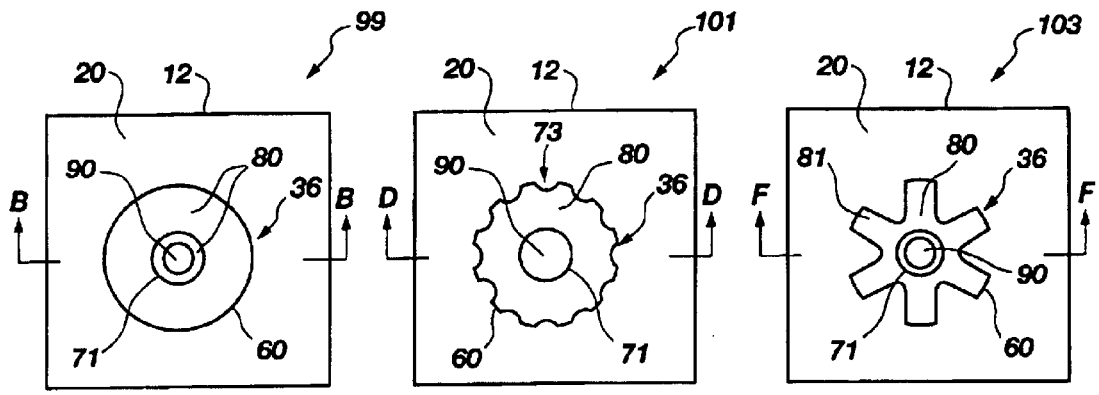
FIGS. 7A through 7L show top views and associated side cross-sectional views of different embodiments of the present invention.
Figures 7B, 7D, 7F:
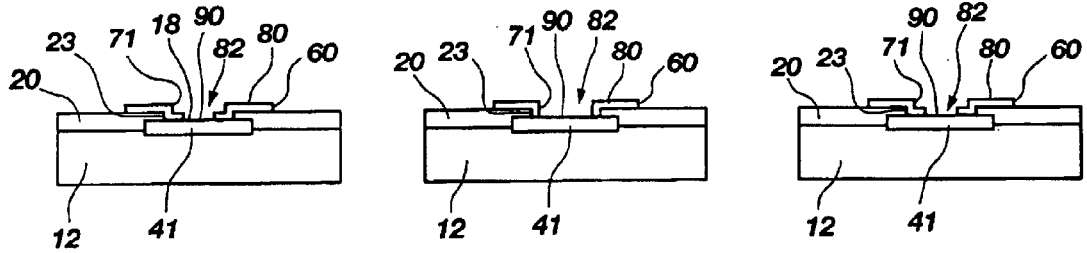

FIGS. 7A through 7L show different embodiments 99, 101, 103, 105, 107 and 109 for a BPS solder ball pad layer 60 of the present invention wherein the solder ball pad layer 60 comprises optional interface layer 38, copper layer 48 as well as solderability enhancement layer 18, but is shown as a single layer 60 in FIGS. 7A through 7L for clarity. FIGS. 7A and 7B show embodiment 99 including a solder ball pad layer 60 configured generally in a circular area wherein the solder ball pad layer 60 includes an aperture 82 therethrough, exposing area 90 of terminal pad 41. Area 90 may include a solderability enhancement layer 18, although this is not shown for clarity. Thus, a solder ball attached to the BPS solder ball pad embodiment shown in FIGS. 7A and 7B may be affixed to the mounting pad 36, mounting pad 36 comprising area 80 of solder ball pad layer 60 including side surface 71 and exposed area 90 of terminal pad 41.

FIGS. 7C and 7D show embodiment 101 including a solder ball pad layer 60 wherein solder ball pad layer 60 includes a terminal aperture 82 exposing area 90 of terminal pad 41. In addition, scallops 73 are formed circumferentially about area 80 of solder ball pad layer 60. Scallops, fingers, spokes, or other laterally extending shapes may be advantageous to increase the surface area of attachment for a solder ball, as well as provide additional vertical surfaces for attachment of a solder ball thereto.

For example, FIGS. 7E and 7F show embodiment 103 including a solder ball pad layer 60 having a terminal aperture 82 exposing area 90 of terminal pad 41 and extending elements 81 configured as radially extending elements generally symmetrically arranged about aperture 23.

Also, as discussed hereinabove, since the centroid of the mounting surface of the solder ball pad influences the position of the solder ball, by employing the solder ball pad of the present invention, the solder ball pad layer 60 may be tailored to position solder balls as desired or to correct for inaccuracy in the placement of apertures in the solder mask 20. More specifically, in the case where solder mask placement is less precise than solder ball pad layer 60 formation, the solder ball pad layer 60 may be used to correct variances in the solder ball mask aperture placement. Thus, each aperture in a solder mask 20 could be measured against a desired placement, and then the solder ball pad layer 60 could be displaced in order to correct for the deviation. Correction may occur prior to formation of the solder ball pad layer 60; thus, aperture 23 position may be determined prior to forming the solder ball pad layer 60 onto the substrate and the position of solder ball layer corrected accordingly. Alternatively, the solder ball pad layer 60 of each mounting pad may be formed and then the solder ball pad layer 60 may be modified to position a solder ball in a desired position. For instance, laser ablation, selective etching, or other removal processes may be used to selectively modify the area of attachment of a solder ball pad, and thus adjust placement of a solder ball attached thereto.

Figures 7G, 7I, 7K:
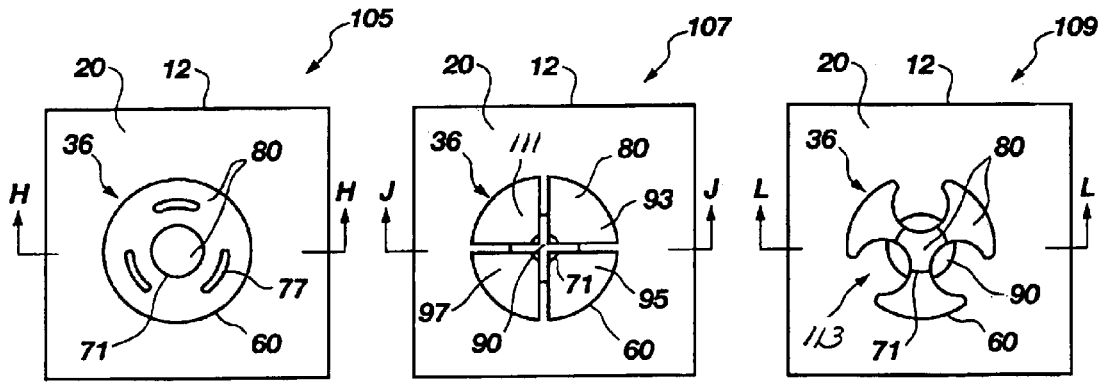
Figures 7H, 7J, 7L:
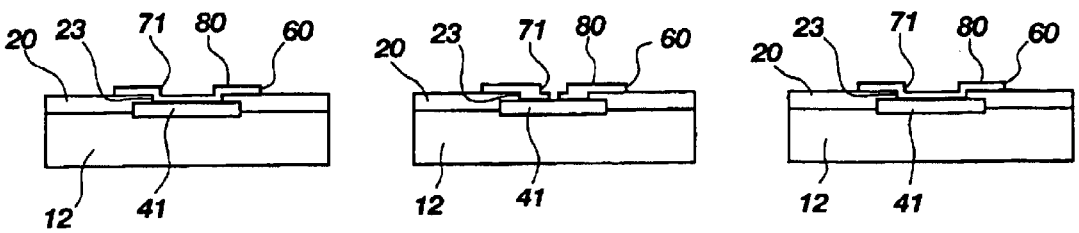

FIGS. 7G and 7H show embodiment 105 including a BPS solder ball pad configuration of the present invention where multiple apertures 77 are formed in solder ball pad layer 60. Apertures 77 allow a solder ball to attach to the vertical sides thereof, thus increasing the surface area of attachment of a solder ball. Apertures 77 are shown as three circumferential slots that are positioned over the surface of solder mask 20.

FIGS. 7I and 7J show embodiment 107 including a BPS solder ball pad configuration of the present invention where individual regions 93, 95, 97, and 111 of solder ball pad layer 60 as well as the exposed area 90 of the terminal pad 41 form the mounting pad 36. Therefore, an attached solder ball will be affixed to areas 80 and 90 as well as side surface 71 and the side surfaces of regions 93, 95, 97, and 111. Such a configuration may be advantageous to provide more surface area for solder ball connection.

Many alternatives are possible, and the present invention is not limited to any one configuration. Individual solder ball pad layer 60 areas in combination with terminal pad 41 areas may form a mounting pad 36. Although the present invention has been described herein as generally configured with a solder ball pad layer 60 that conforms to the solder mask, thus creating a vertical depression consistent with the aperture 23 in the solder mask 20, the vertical surface of the solder ball mounting pad 36 may be tailored as desired. For instance, it may be advantageous to form the solder ball pad layer 60 so that it is substantially planar on its top surface. Conversely, it may be advantageous to create a vertical depression or tailor a vertical depression so as to create increased surface area or to promote bond strength or bond characteristics thereof.

FIGS. 7K and 7L show embodiment 109 including a BPS solder ball pad configuration of the present invention where solder ball pad layer 60 forms areas 80 and includes aperture sections 113 that expose respective areas 90 of terminal pad 41. Such a configuration may provide additional surface area and vertical sidewall attachment of a solder ball to areas 80 as well as provide an attachment area 80 to terminal pad 41. Thus, the mounting pad 36 of the present invention may comprise areas of solder ball pad layer 60 in combination with areas of terminal pad 41.

Figure 8A:
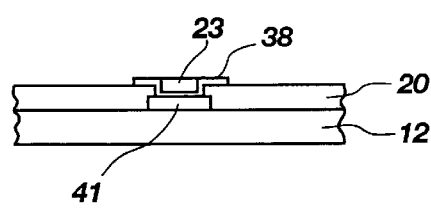
FIGS. 8A and 8B depict an exemplary process flow for forming the solder ball pad structure of the present invention using a conductive polymer interface layer.
Figure 8B:
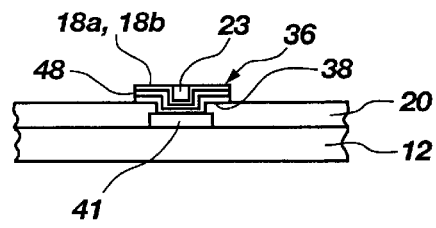

Referring now to FIGS. 8A and 8B of the drawings, a first exemplary process flow for fabricating the inventive structure of the present invention as depicted in FIGS. 3A and 3B is illustrated. As shown in FIG. 8A, a polymer conductive adhesive forming optional interface layer 38 may be applied over solder mask 20 and into aperture 23. By way of example only, suitable conductive polymers in the form of isotropic epoxy adhesives 3880 and 3889 are available from Henkel Loctite Corporation, Connecticut. The polymer interface layer 38 may be applied by stencil printing to cover the surface of terminal pad 41 exposed through aperture 23, the sidewalls of solder mask 20 defining aperture 23 and the top horizontal surface of solder mask 20 to form a collar of the polymer around aperture 23. An electroplated copper layer 48 may then be formed over interface layer 38, followed by electroplating of a nickel layer 18a and a gold layer 18b together comprising solderability enhancement layer 18, all as shown in FIG. 8B. It is also contemplated that a metal interface layer 38 may be applied by stencil printing, followed by electroplating of the copper, nickel and gold layers.

Figure 9:
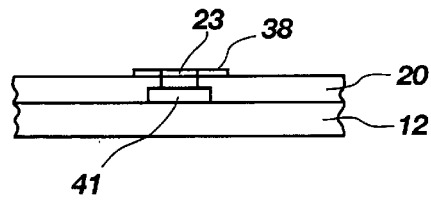
FIG. 9 depicts placement of a nonconductive polymer interface layer in accordance with the present invention.
Figure 10A:
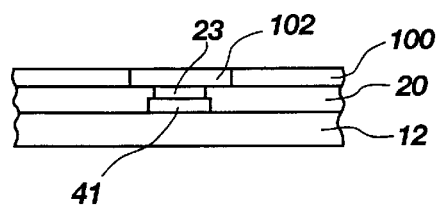
FIGS. 10A through 10D depict a first exemplary process flow for forming the solder ball pad structure of the present invention using an electrolessly plated interface layer.
Figure 10B:
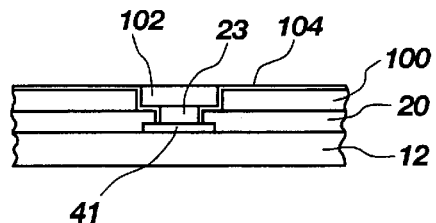
Figure 10C:
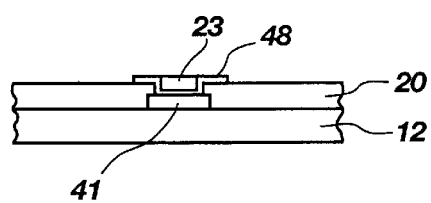
Figure 10D:
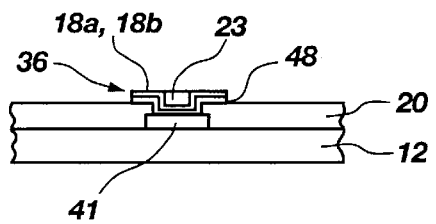

Referring to FIG. 9 of the drawings, an optional interface layer 38 to enhance adhesion to the solder mask 20 may be applied in the form of a nonconductive epoxy such as the aforementioned HYSOL®EO1073 and EO1075 compounds or other suitable polymer by stencil printing over the top surface of solder mask 20 surrounding aperture 23, leaving the exposed area of terminal pad 41 and the sidewalls of solder mask 20 defining aperture 23 free of material In lieu of the use of a conductive or nonconductive polymer as an interface process flow may proceed along several different paths. Referring to FIG. 10A, a "coverlay" element in the form of a dry film photoresist 100 (positive or negative) may be applied over solder mask 20, patterned by exposure to a required wavelength of light through a mask, developed, and portions of the dry film surrounding and extending into aperture 23 removed to expose terminal pad 41 and define annulus 102 surrounding aperture 23. If a nonconductive polymer has been used for adhesion enhancement to solder mask 20, it may already be present on annulus 102. As shown in FIG. 10B a copper seed layer 104, which may comprise a metal interface layer 38, may be electrolessly plated over the dry film photoresist and into aperture 23, covering the exposed portion of terminal pad 41, which seed layer may be augmented by electroplating if desired. Dry film photoresist 100 is then stripped off mechanically or chemically as known in the art, removing with it the overlying copper and leaving the copper layer 48 within and surrounding aperture 23 contacting terminal pad 41 and extending from aperture 23 as a collar over the top surface of solder mask 20, as shown in FIG. 10C. A nickel layer 18a and a gold layer 18b may then be electroplated onto the copper layer 48 to form solderability enhancement layer 18 and complete the structure of solder ball mounting pad 36 as shown in FIG. 10D.

Figure 11A:
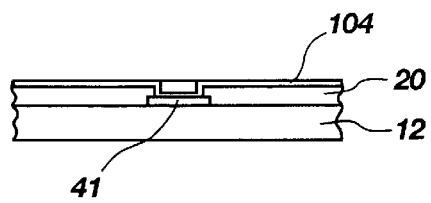
FIGS. 11A through 11D depict a second exemplary process flow for forming the solder ball pad structure of the present invention using an electrolessly plated interface layer.
Figure 11B:
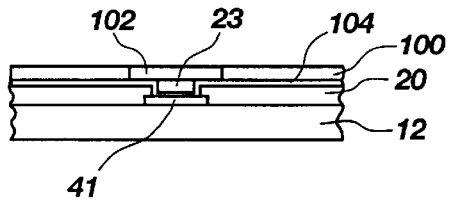
Figure 11C:
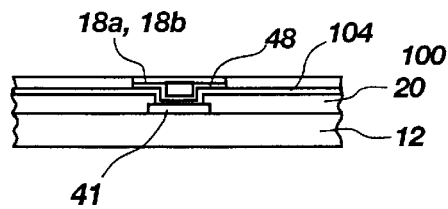
Figure 11D:
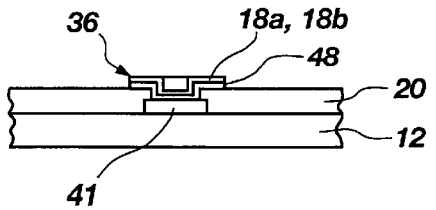

In another process sequence and referring to FIG. 11A, an optional nonconductive polymer interface layer 38 (not shown) may be applied to solder mask 20 in an area surrounding aperture 23. In either case, with or without the presence of optional nonconductive interface layer 38, an electroless copper layer 104, which may itself comprise a conductive interface layer 38, may be applied over solder mask 20, into aperture 23 and over the exposed portion of terminal pad 41. A coverlay element in the form of a dry film photoresist 100 (positive or negative) may be applied over solder mask 20, patterned by exposure to a required wavelength of light through a mask, developed, and portions of the dry film surrounding and extending into aperture 23 removed to expose terminal pad 41 and define annulus 102 surrounding aperture 23 and exposing a portion of electroless copper layer 104, as shown in FIG. 11B. Copper may then be electroplated onto the exposed copper in annulus 102, over sidewalls of solder mask 20 defining aperture 23 and onto the exposed portion of terminal pad 41 to complete copper layer 48, as shown in FIG. 11C. Nickel layer 18a and gold layer 18b may then be electroplated to form solderability enhancement layer 18, again as shown in FIG. 11C. Dry film photoresist 100 may then be stripped off mechanically or chemically, as known in the art, and the underlying electroless copper layer 104 removed by a soft etch comprising an alkaline ammonia solution to complete the fabrication of solder ball pad 36, as shown in FIG. 11D.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A substrate for an electronic device configured for mounting a discrete conductive element thereon, the substrate comprising:

a sheet of insulative material;

a metal layer defining a terminal pad formed on a surface of the sheet;

an insulative mask extending over the sheet and having an aperture therein through which a portion of the terminal pad is exposed; and a bond pad layer comprising;

at least one electrolessly plated copper layer formed over at least a portion of the exposed portion of the terminal pad, extending up a sidewall of the aperture and over a portion of the insulative mask adjacent to the apertures; and at least one electroplated metal layer formed substantially over at least a portion of the at least one electrolessly plated copper layer.

2. The substrate of claim 1, further including an interface layer formed over the at least a portion of the exposed portion of the terminal pad, over the sidewall of the aperture and over the portion of the insulative mask adjacent to the aperture and disposed between the exposed portion of the terminal pad and the bond pad layer.

3. The substrate of claim 1, wherein the bond pad layer comprises at least one metal layer including at least one of an electroplated nickel layer and an electroplated gold layer.

4. The substrate of claim 3, wherein the at least one electroplated metal layer formed substantially over at least a portion of the at least one electrolessly plated copper layer comprises a plurality of metal layers, comprising the electroplated nickel layer formed over the at least a portion of the at least one electrolessly plated copper layer, electroplated gold layer formed over at least a portion of the electroplated nickel layer.

5. The substrate of claim 1, wherein the bond pad layer comprises at least one metal layer wettable by solder or a polymeric conductive material.

6. The substrate of claim 5, wherein the bond pad layer comprises more than two layers wherein an uppermost metal layer of the more than two layers is wettable by solder or a polymeric conductive material.

7. The substrate of claim 1, wherein a surface area of the bond pad layer is larger than a surface area of the exposed portion of the terminal pad.

8. The substrate of claim 7, wherein a surface area of the bond pad layer is about 0.05 square millimeters or larger.

9. The substrate of claim 1, wherein a surface area of the bond pad layer is larger than a surface area of the terminal pad.

10. The substrate of claim 9, wherein a surface area of the bond pad layer is about 0.05 square millimeters or larger.

11. The substrate of claim 1, wherein the bond pad layer partially covers the exposed portion of the terminal pad.

12. The substrate of claim 11, further comprising a solder ball attached to the bond pad layer and the exposed terminal pad.

13. The substrate of claim 12, wherein the solder ball is attached to a side surface of the bond pad layer.

14. The substrate of claim 13, wherein the solder ball is attached to a portion of the bond pad layer extending over the insulative mask.

15. The substrate of claim 12, wherein the solder ball is attached to a portion of the bond pad layer extending over the insulative mask.

16. The substrate of claim 1, wherein the bond pad layer completely covers a top surface of the terminal pad.

17. The substrate of claim 16, further comprising a solder ball attached to the bond pad layer.

18. The substrate of claim 17, wherein the solder ball is attached to a side surface of the bond pad layer.

19. The substrate of claim 18, wherein the solder ball is attached to a portion of the bond pad layer extending over the insulative mask.

20. The substrate of claim 17, wherein the solder ball is attached to a portion of the bond pad layer extending over the insulative mask.

21. The substrate of claim 1, wherein the bond pad layer is substantially circular and has a diameter of about 0.33 millimeter or larger.

22. The substrate of claim 1, wherein the aperture is substantially circular.

23. The substrate of claim 22, wherein a centroid of the bond pad layer substantially coincides with a desired solder ball position.

24. The substrate of claim 23, further including a solder ball attached to the bond pad layer.

25. The substrate of claim 1, wherein the terminal pad has a lateral extent less than a lateral extent of the bond pad layer.

26. A method of forming a substrate for an electronic device configured for mounting a discrete conductive element thereon, comprising:
   providing a sheet of insulative material;
   forming a metal layer defining a terminal pad on a surface of the sheet;
   forming an insulative mask over the sheet having an aperture therein exposing a portion of the terminal pad; and
   forming a bond pad layer, wherein forming the bond pad layer comprises:
   forming at least one electrolessly plated copper layer onto at least a portion of the exposed portion of the terminal pad, extending over a sidewall of the aperture and onto a portion of the insulative mask adjacent to the aperture; and
   forming at least one electroplated metal layer formed over at least a portion of the at least one electrolessly plated metal layer.

27. The method of claim 26, further comprising, prior to forming the bond pad layer, forming an interface layer over the at least a portion of the exposed portion of the terminal pad, over the sidewall of the aperture and over the portion of the insulative mask adjacent to the aperture.

28. The substrate of claim 27, wherein forming the bond pad layer comprising forming at least one metal layer wettable by solder or a polymeric conductive material.

29. The method of claim 26, wherein forming the at least one electroplated metal layer comprises forming at least one of an electroplated nickel layer and an electroplated gold layer.

30. The method of claim 29, wherein forming at least one electroplated metal layer over at least a portion of the at least one electrolessly plated copper layer comprises forming an electroplated nickel layer over at least a portion of the at least one electrolessly plated copper layer and forming an electroplated gold layer over at least a portion of the electroplated nickel layer.

31. The method of claim 30, wherein forming the bond pad layers, comprises forming an uppermost electroplated metal layer that is wettable by solder or a polymeric conductive material.

32. The method of claim 26, further comprising forming a conductive trace on the surface of the sheet.

33. The method of claim 32, wherein forming the conductive trace comprises forming a conductive trace that extends from the terminal pad.

34. The method of claim 26, wherein forming the bond pad layer comprises forming a plurality of individual bond pad layer regions, each individual bond pad layer region electrically connected to the terminal pad.

35. The method of claim 26, further comprising attaching a solder ball at least to the bond pad layer.

36. The method of claim 35, wherein attaching a solder ball at least to the bond pad layer comprises attaching the solder ball to a surface of the terminal pad.

37. The method of claim 35, wherein attaching a solder ball at least to the bond pad layer comprises attaching the solder ball to a surface of the bond pad layer within the aperture.

38. The method of claim 37, wherein attaching a solder ball at least to the bond pad layer comprises attaching the solder ball to a surface of the bond pad layer lying on the sidewall of the aperture.

39. The method of claim 38, wherein attaching a solder ball at least to the bond pad layer comprises attaching the solder ball to a surface of the bond pad layer extending over the insulative mask.

40. The method of claim 26, further comprising measuring a lateral position of the aperture in the insulative mask.

41. The method of claim 40, wherein forming the bond pad layer comprises adjusting formation position of the bond pad layer according to the measured lateral position of the aperture in the insulative mask.

42. The method of claim 41, wherein forming the bond pad layer comprises adjusting a centroid of the bond pad layer according to the measuring the lateral position of the aperture in the insulative mask.

43. The method of claim 42, wherein adjusting the centroid of the bond pad layer comprises removing a portion of the bond pad layer after it has been formed.

44. The method of claim 26, wherein forming the metal layer defining the terminal pad comprises forming the terminal pad to a lesser lateral extent than a lateral extent of the bond pad layer.

45. The method of claim 26, wherein forming the bond pad layer includes forming a substantially circular bond pad layer having a diameter of about 0.33 millimeter or larger.

46. The method of claim 26, wherein forming the bond pad layer comprises forming a surface area of the bond pad layer to be about 0.05 square millimeter or greater.

47. The method of claim 26, wherein forming the bond pad layer comprises forming the bond pad layer having a surface area larger than a surface area of the terminal pad.

48. The method of claim 26, wherein forming the bond pad layer comprises forming the bond pad layer having a surface area larger than the exposed portion of the terminal pad.

49. A method of forming a substrate for an electronic device configured for mounting a solder ball thereon, comprising:
  providing a sheet of insulative material;
  forming a metal layer defining a terminal pad on a surface of the sheet;
  forming an insulative mask over the sheet having an aperture therein exposing a portion of the terminal pad;
  disposing a conductive polymer or a layer comprising metal over the exposed portion of the terminal pad, over sidewalls of the aperture and over a top surface of the insulative mask surrounding the aperture; and
  forming a bond pad layer by sequentially forming, by electroplating layers of copper, nickel, and gold onto the conductive polymer.

50. A method of forming a substrate for an electronic device configured for mounting a solder ball thereon, comprising:
  providing a sheet of insulative material;
  forming a metal layer defining a terminal pad on a surface of the sheet;
  forming an insulative mask over the sheet having an aperture therein exposing a portion of the terminal pad;
  stencil printing a conductive polymer or a layer comprising metal over the exposed portion of the terminal pad, over sidewalls of the aperture and over a top surface of the insulative mask surrounding the aperture; and
  forming a bond pad layer comprising at least one metal layer onto the conductive polymer.

51. A method of forming a substrate for an electronic device configured for mounting a solder ball thereon, comprising:
  providing a sheet of insulative material;
  forming a metal layer defining a terminal pad on a surface of the sheet;
  forming an insulative mask over the sheet having an aperture therein exposing a portion of the terminal pad;
  electrolessly plating copper over a top surface of the insulative mask, over sidewalls of the aperture and over the exposed portion of the terminal pad;
  forming a dry film resist over the insulative mask exposing the aperture and an area of the insulative mask about the aperture;
  electroplating a layer of nickel within the aperture and over the exposed area of the insulative mask; and
  electroplating a layer of gold over the layer of nickel.

52. The method of claim 51, further comprising electroplating a layer of copper within the aperture prior to electroplating the layer of nickel.

53. The method of claim 51, further comprising removing the dry film resist.

54. The method of claim 51, further comprising disposing a nonconductive polymer interface layer over an area of the insulative mask surrounding the aperture before electrolessly plating the copper.

55. A method of forming a substrate for an electronic device configured for mounting a solder ball thereon, comprising:
  providing a sheet of insulative material;
  forming a metal layer defining a terminal pad on a surface of the sheet;
  forming an insulative mask over the sheet having an aperture therein exposing a portion of the terminal pad;
  forming a dry film resist over the insulative mask exposing the aperture and an area of the insulative mask about the aperture;
  electrolessly plating copper over the dry film resist, over the exposed area of the insulative mask, over sidewalls of the aperture and over the exposed portion of the terminal pad;
  removing the dry film resist;
  electroplating a layer of nickel over the copper; and
  electroplating a layer of gold over the layer of nickel.

56. The method of claim 55, further comprising electroplating a layer of copper prior to electroplating the layer of nickel.

57. The method of claim 51, further comprising disposing a nonconductive polymer interface layer over an area of the insulative mask surrounding the aperture before electrolessly plating the copper.

* * * * *